(12) United States Patent
Molnar

(10) Patent No.: US 9,970,126 B2
(45) Date of Patent: May 15, 2018

(54) PRODUCTION OF FREE-STANDING CRYSTALLINE MATERIAL LAYERS

(71) Applicant: Massachusetts Institute of Technology, Cambridge, MA (US)

(72) Inventor: Richard J. Molnar, Harvard, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days. days.

(21) Appl. No.: 14/770,194

(22) PCT Filed: Feb. 20, 2014

(86) PCT No.: PCT/US2014/017422
§ 371 (c)(1),
(2) Date: Aug. 25, 2015

(87) PCT Pub. No.: WO2014/133866
PCT Pub. Date: Sep. 4, 2014

(65) Prior Publication Data
US 2016/0002822 A1   Jan. 7, 2016

Related U.S. Application Data

(60) Provisional application No. 61/769,246, filed on Feb. 26, 2013.

(51) Int. Cl.
| C30B 23/02 | (2006.01) |
| C30B 25/18 | (2006.01) |
| C30B 29/40 | (2006.01) |
| H01L 31/0304 | (2006.01) |
| C30B 7/10 | (2006.01) |
| C30B 9/04 | (2006.01) |
| C30B 25/20 | (2006.01) |

(Continued)

(52) U.S. Cl.
CPC ............ C30B 23/025 (2013.01); C30B 7/105 (2013.01); C30B 9/04 (2013.01); C30B 25/183 (2013.01);

(Continued)

(58) Field of Classification Search
CPC combination set(s) only.
See application file for complete search history.

(56) References Cited

U.S. PATENT DOCUMENTS 5,549,747 A * 8/1996 Bozler .................... C30B 25/04
                                                    117/10
6,086,673 A * 7/2000 Molnar .................... C30B 25/02
                                                    117/102

(Continued)

FOREIGN PATENT DOCUMENTS

DE      224341 A1    7/1985

OTHER PUBLICATIONS

PCT/US2014/017422, International Search Report, PCT/ISA/210 first sheet, continuation of first sheet(3), and second sheet, dated Jun. 2, 2014.

(Continued)

*Primary Examiner* — Duy Vu N Deo
*Assistant Examiner* — Erin F Bergner
(74) *Attorney, Agent, or Firm* — Theresa A. Lober

(57) ABSTRACT

Herein is provided a growth structure for forming a free-standing layer of crystalline material having at least one crystallographic symmetry. The growth structure includes a host substrate and a separation layer disposed on the host substrate for growth of a layer of the crystalline material thereon. The separation layer has a separation layer thickness, and is mechanically weaker than the host substrate and the crystalline material. An array of apertures is in the separation layer, each aperture extending through the separation layer thickness.

15 Claims, 3 Drawing Sheets

(51) Int. Cl.
*C30B 29/36* (2006.01)
*H01L 21/02* (2006.01)

(52) U.S. Cl.
CPC .............. *C30B 25/20* (2013.01); *C30B 29/40* (2013.01); *C30B 29/406* (2013.01); *H01L 31/03044* (2013.01); *C30B 29/36* (2013.01); *H01L 21/0254* (2013.01); *H01L 21/02458* (2013.01); *H01L 21/02639* (2013.01); *Y02E 10/544* (2013.01)

(56) References Cited

U.S. PATENT DOCUMENTS

| | | | |
|---|---|---|---|
| 6,413,627 B1 | 4/2002 | Motoki et al. | |
| 6,673,149 B1 * | 1/2004 | Solomon | C30B 23/02 117/101 |
| 2002/0011599 A1 | 1/2002 | Motoki | |
| 2002/0197825 A1 | 12/2002 | Usui et al. | |
| 2007/0082465 A1 | 4/2007 | Song et al. | |
| 2008/0006849 A1 | 1/2008 | Liu et al. | |
| 2012/0119236 A1 | 5/2012 | Yu et al. | |
| 2012/0190148 A1 | 7/2012 | Lin et al. | |

OTHER PUBLICATIONS

PCT/US2014/017422, Written Opinion of the International Searching Authority, PCT/ISA/237 cover sheet, Box No. 1 sheet, Box No. V sheet, Supplemental Box sheet-five pages, dated Jun. 2, 2014.
Kobayashi et al., "Layered boron nitride as a release layer for mechanical transfer of GaN-based devices," Nature, vol. 484, pp. 223-227, Apr. 12, 2012.

* cited by examiner

PRODUCTION OF FREE-STANDING CRYSTALLINE MATERIAL LAYERS

CROSS-REFERENCE TO RELATED APPLICATIONS

This application claims the benefit of U.S. Provisional Application No. 61/769,246, filed Feb. 26, 2013, the entirety of all of which is hereby incorporated by reference.

STATEMENT REGARDING FEDERALLY SPONSORED RESEARCH

This invention was made with Government support under Contract No. FA8721-05-C-0002, awarded by the Air Force. The Government has certain rights in the invention.

BACKGROUND

This invention relates generally to the production of free-standing material layers, and more particularly relates to structure and techniques for the production of a free-standing crystalline material layer after formation of that layer.

For many optical and electronic device applications, it is becoming increasingly important to produce free-standing structures, such as free-standing substrates and layers, of various semiconducting materials for which bulk substrates cannot be conventionally produced. For example, the class of group III, nitride-based semiconductors, or III-N semiconductors, are rapidly becoming the materials of choice for short wavelength light emitters as well as high-frequency, high-power electronics, but development of such electronics has been limited by the difficulty in production of large-area native III-N material substrates such as gallium nitride (GaN) substrates.

In general, in the production of substrates such as GaN substrates, a deposition process, such as an epitaxial deposition process, is employed to produce an epitaxial layer of, e.g., GaN, on a supporting, or host, substrate, which may include a growth seed layer. After growth of the epitaxial layer, the underlying host substrate is removed to produce free-standing material, e.g., a GaN layer or substrate. Complete removal of the host substrate is desirable, for example, to reduce stress in the epitaxial layer due to, for example, a difference in thermal expansion coefficient between the epitaxial layer and host substrate. Removal of the host substrate is also preferred to control the electrical conductivity of the epitaxial layer, to control the thermal conductivity of the epitaxial layer, and to control the optical properties of the epitaxial layer for a given device application. But in general, conventional host substrate removal techniques tend to cause defects or even cracks in a semiconductor epitaxial layer formed on the host substrate, and are slow and irreproducible, and therefore not cost-effective processes for incorporation into a microfabrication process sequence.

SUMMARY OF THE INVENTION

Herein is provided an epitaxial growth structure, and accompanying process, that enables growth of an epitaxial layer and removal of an underlying host substrate. In one example of such, there is provided a growth structure for forming a free-standing layer of crystalline material having at least one crystallographic symmetry. The growth structure includes a host substrate and a separation layer disposed on the host substrate for growth of a layer of the crystalline material thereon. The separation layer has a separation layer thickness, and is mechanically weaker than the host substrate and the crystalline material. An array of apertures is disposed in the separation layer, with each aperture extending through the separation layer thickness. The array of apertures has an array symmetry that matches a crystallographic symmetry of the crystalline material.

In a process provided herein for producing a free-standing layer of material, a separation layer is formed on a host substrate, and the separation layer is patterned to form a prespecified array of apertures in the separation layer. An upper material layer is formed on the separation layer, and the separation layer exposed to a temperature that separates at least a portion of the separation layer and the upper material layer from the host substrate.

This growth structure and the growth process for producing a free-standing material layer or substrate provides substantial advantages over conventional material separation techniques, including advantages in yield, scalability, and fabrication cost. The growth structure and associated growth technique is suitable for any material formation process and enables a wide range of applications for which free-standing material layers are required. Other features and advantages will be apparent from the following description and the accompanying drawings, and from the claims

DETAILED DESCRIPTION

Figure 1A:
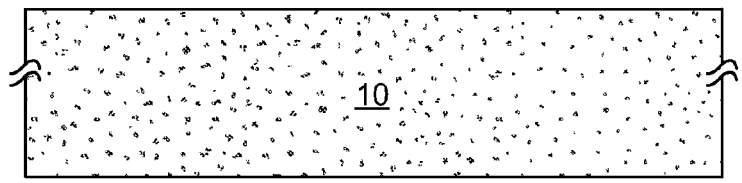
FIGS. 1A-1F are schematic cross-sectional views of an example growth structure and associated growth process described herein for producing a free-standing crystalline material layer with a separation layer provided herein.

Referring to FIG. 1A, in the formation of a growth structure for producing a free-standing layer or substrate from a deposited layer of semiconducting crystalline material, there is first provided a host substrate 10, having a material composition selected based on the desired composition of a free-standing crystalline material layer or substrate to be formed. Any suitable microelectronic material substrate can be employed, e.g., including silicon, sapphire, GaN, oxides, nitrides, SiC, GaAs, or other suitable material, provided as a substrate, wafer, or other structure of a selected semiconducting, conducting, or insulating material that is compatible with the subsequent crystalline material layer formation process described below.

Figure 1B:
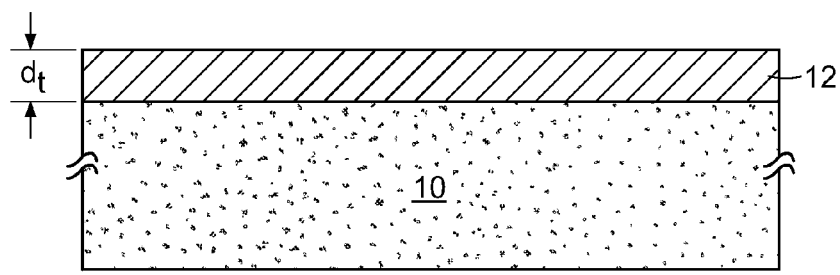

Referring to FIG. 1B, there can optionally be provided on the host substrate 10 a growth template material layer 12, which can have the material composition of the desired free-standing crystalline material layer to be formed, or another suitable material composition that is epitaxially compatible with the crystalline material layer to be formed. The growth template layer provides sites for homogeneous nucleation of the crystalline material layer to be formed. The thickness, $d_t$, of the template layer can for many applications be preferably as thin as possible to reduce thermo-mechanical stress, which can cause bowing of the entire growth structure during thermal processing, and to obtain for the crystalline material layer to be grown a smoother material layer surface. Given an example of GaN material layer production, the template layer can be provided as a GaN layer, having a thickness of, e.g., between about 10 nm and about 3 microns. The template layer 12 is formed by any suitable deposition process, e.g., including vapor deposition or epitaxial deposition, such as hydride vapor phase epitaxial deposition (HVPE), chemical vapor deposition (CVD), such as low-pressure chemical vapor deposition (LPCVD), plasma enhanced CVD (PECVD), organo-metallic chemical vapor deposition (OMCVD), sputtering, or other suitable process. The growth template material layer is optional and need not be included in the structure if such is not required.

Figure 1C:
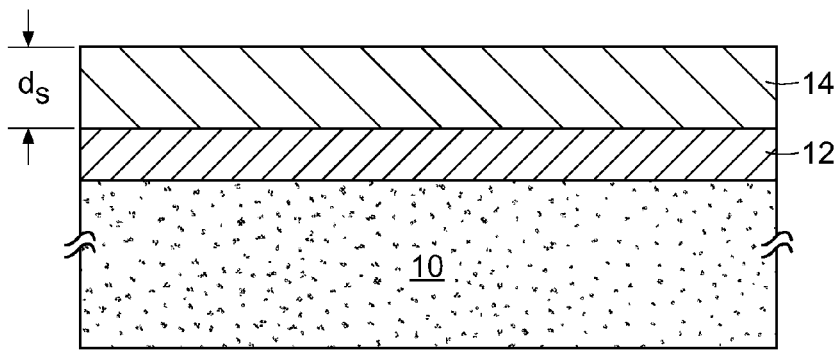

Referring to FIG. 1C, there is formed on the surface of the host substrate 10 or the growth template layer 12 a separation layer 14. The separation layer 14 in general preferably includes a composition that exhibits mechanical weakness in the plane of the layer, for example, due to weak bonding in the plane. Under these conditions, the separation layer 14 provides a mechanically weak layer between the lower host substrate 10 or growth template layer 12 and the material layer to be subsequently formed on top of the separation layer. The separation layer therefore is a physical plane—the separation layer is substantially mechanically weaker than all of the other materials and material layers in the growth structure, so that mechanical strain, e.g., thermally-induced strain, produced in growth structure during the upper crystalline material layer growth and cool-down after growth, is released from the growth structure by fracture of the separation layer. This fracture of the separation layer removes the upper material layer from the underlying host substrate, substantially without damage to the upper crystalline material layer. Any separation layer material on the upper material layer can subsequently be removed, to form a freestanding layer or substrate of the upper layer material.

In one example configuration, the separation layer is provided as a composition that includes or consists of a graphitic material, such as boron nitride (BN), graphitic carbon, multi-layer graphene, graphene, flaked graphite, or other suitable graphitic material. A layer of fullerene structures, such as a layer of carbon nanotubes, can also be employed. Alternative to graphitic materials, there can be employed as the separation layer any material that enables fracture of the layer to separate the upper crystalline layer. Layers of polymers, such as a thermally-reduced polymer, hydrogen-implanted materials, or engineered materials having a mechanical weakness in the plane of the material layer can be employed.

The separation layer can be formed by any suitable process, e.g., RF sputtering, CVD, atomic layer deposition (ALD), pulsed layer deposition (PLD), thermal evaporation, or other suitable formation process, including physical liquid, and vapor deposition processes in general. For example, a separation layer of BN can be deposited by RF reactive sputtering from a pyrolytic BN target in an atmosphere of $N_2$ and Ar. No particular formation process is required. The separation layer can be first formed on a second structure or film and then transferred from that second structure or film to the growth structure, rather than being formed in situ on the growth structure itself.

Referring back to FIG. 1C, the thickness, $d_s$, of the separation layer 14 is selected specifically to enable both successful growth of an upper crystalline material layer on the separation layer and successful separation, e.g., by fracture, of the separation layer from the underlying host substrate. The separation layer preferably is thin enough to prohibit peeling of the upper crystalline material layer during growth of the upper material layer, and preferably is thick enough to ensure that separation from the underlying substrate can occur during or after the upper material layer growth but before cracks are generated in the upper material layer due to the mismatch in thermal expansion coefficients between the separation layer and underlying host substrate.

The thickness of the separation layer is also preferably selected based on the composition of the upper material layer to be formed, the material layer deposition conditions, and the host substrate and growth template materials. It can be preferred to optimize the separation layer thickness so that the separation layer does not fracture until some thickness of stable material layer growth is completed. But it is to be recognized that during very thick material layer growth, fracture of the separation layer can commence prior to the completion of the material layer growth, and such fracture is not detrimental to the material layer growth. Empirical analysis for thickness optimization can therefore be preferred. For the example of GaN material layer formation, a sputtered BN separation layer having a thickness between about 30 nm and about 120 nm, preferably less than 75 nm, e.g., between about 40 nm and 75 nm, and more preferably no more than about 60 nm, can be preferred to grow a GaN layer of any selected thickness, e.g., more than 500 microns, with no upper limit on GaN layer thickness. The required BN layer thickness depends on the quality of the BN material.

Figure 2A:
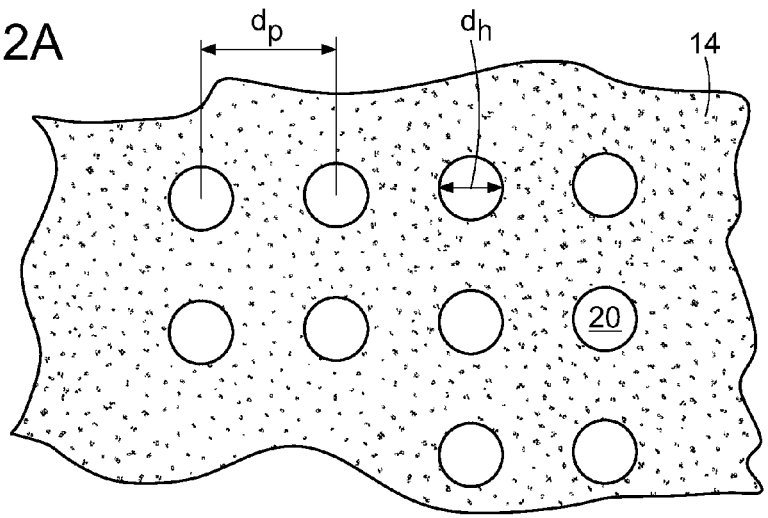
FIGS. 2A-2B are schematic top-down views of example patterns for patterning the separation layer of FIGS. 1A-1F.

Referring also to FIG. 2A, the separation layer 14 is provided with apertures, or openings 20, having a prespecified size, shape, and arrangement, and if desired, number, across the extent of the separation layer 14. In the subsequent upper material layer growth step, the material layer grows through the openings, from the underlying substrate or template layer, vertically upward and laterally over the separation layer, to form a blanket layer of the selected growth material. As shown in FIG. 2A, the arrangement of apertures in the separation layer can be periodic, aperiodic, or otherwise preselected, with each aperture having a prespecified size and shape, and with a selected distance between adjacent apertures. In one example of such, there is provided in the separation layer an arrangement of circular apertures, with each aperture hole having a hole diameter, $d_h$, and a hole periodicity, $d_p$. Any suitable opening shape can be employed, and it is not required that each opening shape in an arrangement of openings be identical. For some applications, it can be preferred to provide apertures away from the edges of the layer so that crystalline material nucleation does not occur at the edge, to prohibit edge growth; nucleation of growth inset from the edges can in this way be ensured.

The spacing between the openings, e.g., the aperture periodicity, $d_p$, across the arrangement of apertures in the separation layer, is preferably designed to have a periodicity that is based on the crystallographic orientation of the upper material layer to be grown on the separation layer. For example, for GaN, Si, or other crystalline material to be grown that exhibits a crystallographic symmetry e.g., 3-fold or 6-fold symmetry—the separation layer openings are preferably arranged in an array with a corresponding symmetry that matches one of the crystallographic symmetries in the growth plane of the crystalline material, e.g., 6-fold or 3-fold symmetry.

All crystalline materials can be characterized by an inherent symmetry, which herein refers to a condition by which under various geometric operations the crystal remains unchanged. All crystalline materials have translational symmetry in three directions, but some have other symmetry elements as well. For example, rotating a crystal 180° about an axis of the crystal structure may result in an atomic configuration that is identical to the original configuration.

The crystal is then said to have a twofold rotational symmetry about this axis. In addition to rotational symmetries, a crystalline material can have symmetries that result from mirror crystal planes, can have translational symmetries, and can have compound symmetries, resulting from a combination of translation and rotation or mirror symmetries The array of apertures in the separation layer is preferably configured with a symmetry that matches the crystallographic symmetry of the crystalline material in the growth plane of the material. This condition ensures that flat crystalline facets of the upper material layer that grow through the separation layer openings overgrow the separation layer and meet at flat faces that are parallel to each other, to coalesce uniformly, thereby to form a continuous material layer over the discontinuous separation layer. The symmetric aperture array thereby provides more consistent and uniform coalescence of the overgrowing crystalline material. Depending on the aperture configuration, dislocations can be filtered out of the crystalline material growth, and the strain and layer separation can be controlled to consistently occur at a prespecified selected time in the process, producing a higher process yield.

Figure 1D:
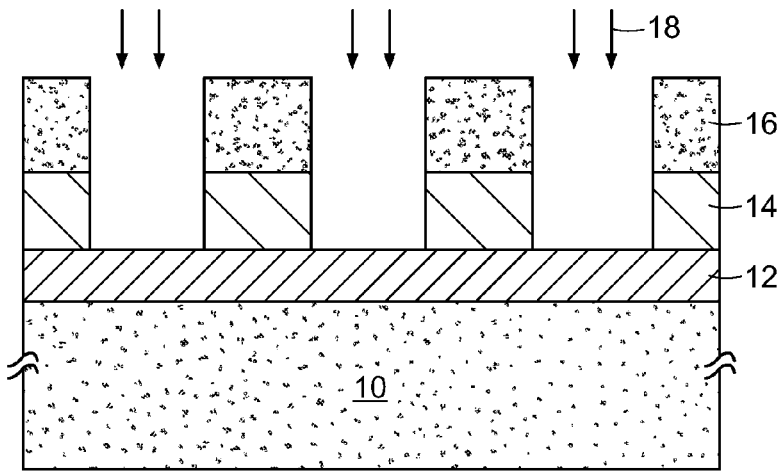
Figure 2B:
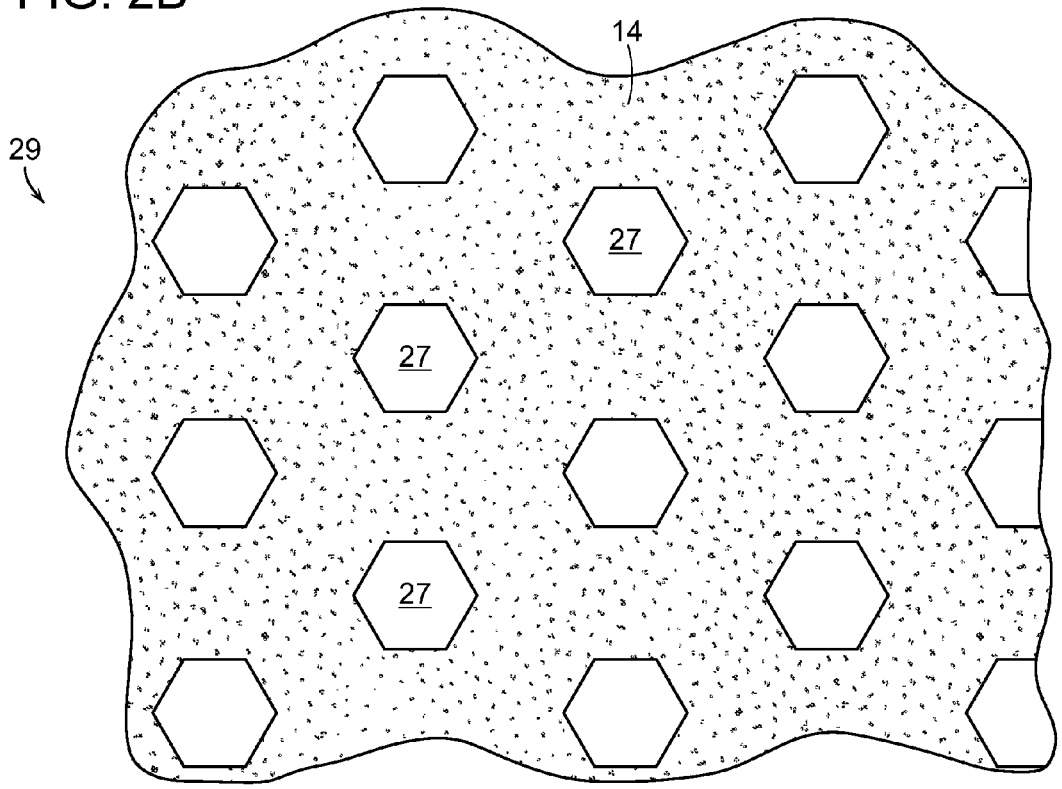

FIG. 2B is an example of such a 6-fold symmetric pattern of openings, wherein hexagonal openings 27 are arranged in a symmetrical array 29 across the separation layer 14. The hexagonal opening shape is not required; it is recognized that in general, curved geometries cannot be produced with conventional photolithographic mask-based processes, and such a hexagonal opening geometry can be employed for the opening geometry. The symmetric arrangement of the openings here enables the upper material layer to uniformly coalesce into a uniform crystalline morphology from faceted islands that grow through the separation layer openings. A mask aperture array periodicity of less than about 100 microns can be preferred Because the separation layer is provided with a prespecified aperture geometry and size, and a prespecified aperture periodicity, it is preferred that the separation layer be intentionally patterned, e.g., lithographically patterned, as part of the growth structure formation process, with, e.g., a selected mask that defines the prespecified openings in the separation layer. Lithography is not required, but it is preferred that an aperture formation process in which prespecified apertures are formed in a prespecified arrangement be employed. Referring to FIG. 1D, in one example of such a lithographic process, the separation layer 14 is coated with a blanket layer of photoresist 16 and the photoresist layer is lithographically exposed with the desired mask pattern for the separation layer aperture geometry and arrangement. Dry etching 18 with a suitable vapor etch process, e.g., plasma etch, or other suitable etch process, whether wet or dry, is then employed to transfer the mask pattern from the layer of photoresist into the underlying separation layer 14, exposing regions of the surface of the template layer 12 or the substrate 10 through the resulting apertures in the template layer.

Any suitable mask pattern and aperture opening pattern can be employed. The apertures can be distinctly separated or can be laterally connected. For example, grating patterns, hole patterns of any geometry, or other pattern can be employed. It is found that grating patterns can cause anisotropic strain in the structure under some conditions, and therefore may not be preferable for all applications. Holes or other such apertures may therefore be preferred for some applications. For the example array of mask holes in FIG. 2A, e.g., an aperture diameter, or aperture extent, of, e.g., between about 0.1 microns and about 10 microns can be preferred, and an aperture periodicity of, e.g., between about 0.5 microns and about 50 microns can be preferred. Any suitable masking pattern can be employed. Once the separation layer 14 is patterned, the photoresist layer 16 is removed.

Figure 1E:
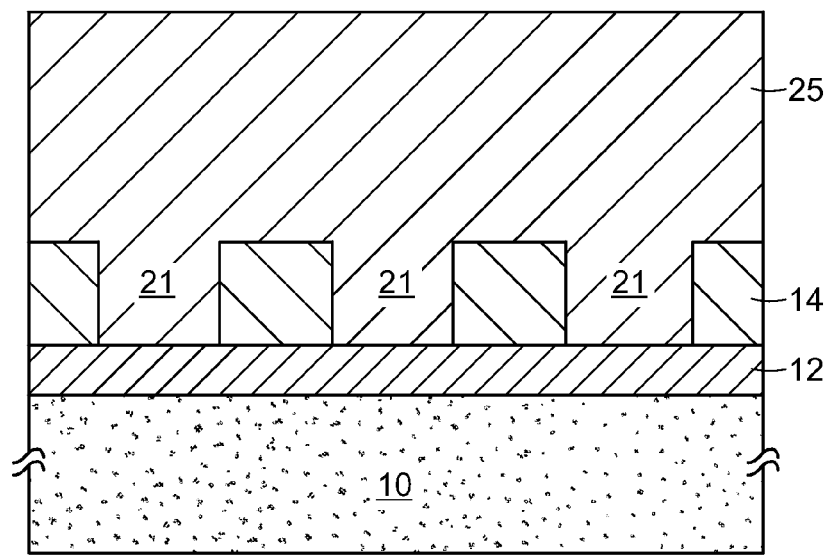

The growth structure is then exposed to selected process conditions to produce a crystalline semiconducting material layer on top of the separation layer. Referring to FIG. 1E, the crystalline material layer 25 nucleates at the surface of the template layer 12 or the host substrate 10, grows vertically up through the openings 21 in the separation layer 14, and coalesces laterally over the top of the separation layer to form a continuous crystalline material layer 25. At this point, the growth structure thereby includes all of the host substrate, optional growth template layer, patterned separation layer, and upper crystalline semiconductor material layer. For example, given growth of a GaN material layer, HVPE GaN growth can be carried out, e.g., at a temperature of between about 950° C. and about 1100° C. After material layer growth, the growth structure is cooled, with a ramp rate that preferably prohibits thermal shock to the growth structure. For example, a cool down from a growth temperature of about 1070° C. to room temperature over a duration of about 10 minutes can be suitable.

The crystalline semiconductor material layer can be formed of any desired thickness, ranging from nanometers to microns, and can be substantially thick, having a thickness of 1000s of microns or more, e.g., 10 mm. For many applications, it can be preferred to produce a relatively thick crystalline material layer, given that it is desired to render that layer free-standing. The characteristics of the selected material layer composition are also to be considered. For example, the material layer preferably is thick enough to exhibit a dislocation density that is sufficiently low for a given application. Additionally, the crystalline material layer is preferably thick enough to provide some thickness of sacrificial material, if the layer is to be polished, and to provide sufficient material if the layer is to be sliced to yield multiple substrates. Conversely, the material layer can be provided as a relatively thin layer that can be bonded to a so-called handle-wafer for further processing after removal of the host substrate.

During growth of the crystalline material layer 25, and cool down of the entire growth structure after material layer growth, the separation layer 14 controls the release of stress buildup in the growth structure due to mismatch in the thermal expansion coefficients of each of the materials in the growth structure. The separation layer, being substantially mechanically weaker than the other materials in the growth structure, is a mechanical plane of controlled breakage between the material layer 25 and template layer 12 and host substrate 10.

Figure 1F:
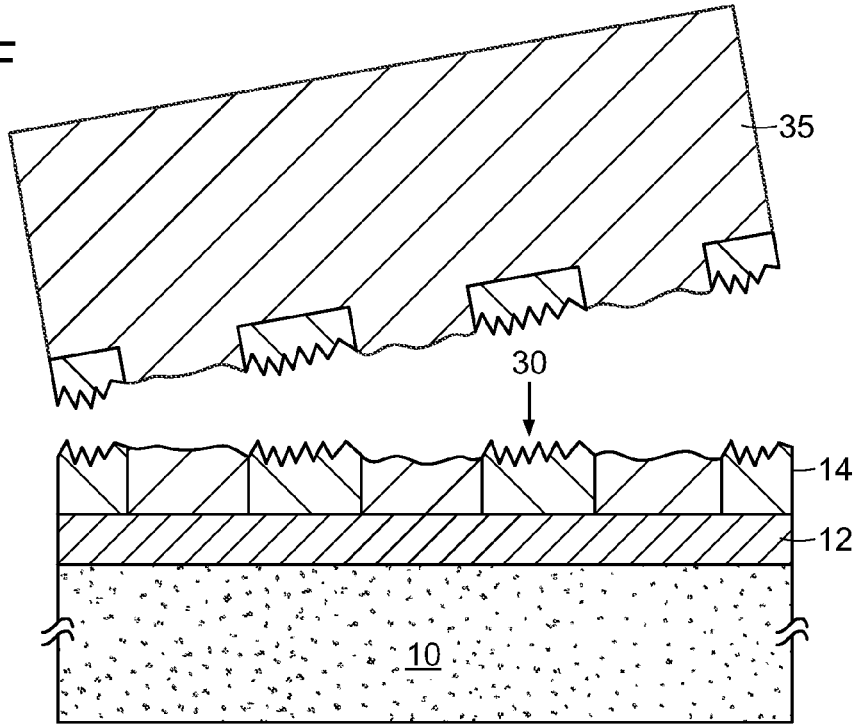

Referring to FIG. 1F, the separation layer thickness, patterned aperture geometry, as well as aperture periodicity and dimensions together determine when a fracture 30 along the plane of the separation layer will occur during processing to thereby separate at least a portion of the separation layer and to thereby separate the crystalline material layer from the host substrate 10 and produce a free-standing crystalline material layer 35. The dimensions and periodicity of the apertures are preferably selected to enable concentration of stress at localized sites where the crystalline material layer 35 has growth through the apertures, so that the crystalline material layer separates with the separation layer from the underlying substrate.

The preferred time of separation layer fracture can be for many applications after the completion of the crystalline material layer growth, e.g., during cool down, or at a later point in the process. But during the growth of a relatively thick crystalline material layer, the strain in the structure can become sufficiently high that the separation layer begins to fracture during growth; such in situ fracture can be employed for many applications. The fracture of the separation layer can be caused to occur at a selected time. For example, after connection of the crystalline material layer to an upper handle wafer or other handle structure, the growth structure can be pulled apart, causing the separation layer to fracture. No particular fracture time is required; the parameters of the separation layer can be tailored to achieve a selected fracture point.

This growth structure and the growth process for producing a free-standing material layer or substrate provides substantial advantages over conventional substrate separation techniques, including advantages in yield, scalability, and fabrication cost. The growth structure and associated growth technique is suitable for any material formation process, including ammonothermal, solution-growth, molecular beam epitaxy (MBE), metalorganic vapor phase epitaxy (MOCVD), or other material deposition process. Any host substrate can be employed; a growth template layer is not required, and is only needed when a particular material growth requires such. Bulk, free-standing material structures of any selected material layer, particularly semiconductor crystalline materials, such as GaN, SiC, AlInGaN, GaAs, InP, and other semiconductor materials can be formed with the growth structure and growth process.

It is recognized that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

I claim:

1. A growth structure for forming a free-standing layer of crystalline material having six-fold rotational crystallographic symmetry, the growth structure comprising:
   a host substrate;
   a separation layer disposed on the host substrate for growth of a layer of the crystalline material on the separation layer, the separation layer having a separation layer thickness, and the separation layer having a composition that exhibits mechanical weakness in the plane of the separation layer, thereby being mechanically weaker than the host substrate and the crystalline material layer;
   an array of apertures disposed in the separation layer, each aperture in the array extending through the separation layer thickness;
   a crystalline growth plane in each of the apertures in the array of apertures, the crystalline growth plane having six-fold rotational crystallographic symmetry; and
   the array of apertures disposed in the separation layer having six-fold rotational symmetry.

2. The growth structure of claim 1 further comprising a growth template layer disposed on the host substrate under the separation layer and providing a surface for nucleation of a crystalline growth plane in the apertures of the separation layer, wherein the growth template layer comprises a compositional component of the crystalline material.

3. The growth structure of claim 1 further comprising a layer of the crystalline material disposed an the separation layer.

4. The growth structure of claim 3 wherein the crystalline material is monocrystalline.

5. The growth structure of claim 3 wherein the crystalline material layer comprises a crystalline III-V semiconducting material.

6. The growth structure of claim 2 wherein the growth template layer comprises GaN, and further comprising a crystalline material layer of GaN disposed on the separation layer and extending down through the apertures in the separation layer to the growth template layer.

7. The growth structure of claim 3 wherein the crystalline material layer comprises a nitride.

8. The growth structure of claim 1 wherein the separation layer comprises a layer of a graphitic material.

9. The growth structure of claim 8 wherein the separation layer comprises a layer of a material selected from the group consisting of boron nitride and graphitic carbon.

10. The growth structure of claim 8 wherein the separation layer comprises a layer of a material selected from the group consisting of multi-layer graphene, graphene, and fullerene structures.

11. The growth structure of claim 8 wherein the separation layer comprises a layer of boron nitride having a thickness that is less than about 75 nm.

12. The growth structure of claim 1 wherein the crystalline growth plane exposed in each of the apertures in the array of apertures comprises a crystalline gallium nitride growth plane.

13. The growth structure of claim 1 wherein the array of apertures disposed in the separation layer comprises an array of generally circular apertures.

14. The growth structure of claim 1 wherein the array of apertures disposed in the separation layer has an aperture periodicity that is less than about 100 microns.

15. The growth structure of claim 1 further comprising a growth template layer disposed on the host substrate under the separation layer and providing a surface for nucleation of the crystalline growth plane in the apertures of the separation layer, wherein the growth template layer comprises a composition that is epitaxially compatible with crystalline gallium nitride.

* * * * *